United States Patent [19]
Davidson et al.

[11] Patent Number: 6,138,469
[45] Date of Patent: *Oct. 31, 2000

[54] REFRIGERATION SYSTEM FOR ELECTRONIC COMPONENTS HAVING ENVIRONMENTAL ISOLATION

[75] Inventors: Howard L. Davidson, San Carlos, Calif.; Dennis M. Pfister, N. Attleboro, Mass.; Charles Byrd, Pacifica, Calif.

[73] Assignee: Sun Microsystems, Inc., Palo Alto, Calif.

[*] Notice: This patent is subject to a terminal disclaimer.

[21] Appl. No.: 09/160,636

[22] Filed: Sep. 24, 1998

Related U.S. Application Data

[63] Continuation-in-part of application No. 08/821,258, Mar. 20, 1997, Pat. No. 5,855,119, which is a continuation-in-part of application No. 08/811,759, Mar. 6, 1997, Pat. No. 5,855,121, which is a continuation-in-part of application No. 08/533,153, Sep. 20, 1995, abandoned.

[51] Int. Cl.$^7$ ..................................................... F25D 23/12
[52] U.S. Cl. .............................................................. 62/259.2
[58] Field of Search .............................................. 62/259.2

[56] References Cited

U.S. PATENT DOCUMENTS 5,855,119  1/1999  Pfister et al. ............................ 62/259.2

*Primary Examiner*—William Doerrler
*Assistant Examiner*—Mark Shulman
*Attorney, Agent, or Firm*—Conley, Rose & Tayon, PC; Eric B. Meyertons

[57] ABSTRACT

To cool heat-emitting electronic components, a compact, non-moving-parts compressor, an evaporator in juxtaposition to the electronic components and a condenser are mounted as a unit, preferably within a vacuum can. A heat exchanger is mounted external to the can but in proximity to the condenser. The foregoing comprise a unit which may be detachably connected to a host pump and heat exchanger. The unit may be removed from the system of which it is a part for upgrade and maintenance. All its components are thermally isolated from the ambient atmosphere to prevent water vapor condensation corrosion.

46 Claims, 18 Drawing Sheets

REFRIGERATION SYSTEM FOR ELECTRONIC COMPONENTS HAVING ENVIRONMENTAL ISOLATION

CROSS REFERENCE TO RELATED APPLICATIONS

This is a continuation-in-part of U.S. patent application Ser. No. 08/821,258 filed Mar. 20, 1997 now U.S. Pat. No. 5,855,119, which is a continuation-in-part of U.S. patent application Ser. No. 08/811,759 filed on Mar. 6, 1997, now U.S. Pat. No. 5,855,121, which is a continuation of U.S. patent application Ser. No. 08/533,153 filed on Sep. 20, 1995, now abandoned.

BACKGROUND OF THE INVENTION

1. Field of the Invention.

The present invention relates to sorption systems wherein a sorbate is alternately adsorbed onto and desorbed from a sorbent. More particularly, the invention relates to a refrigeration sorption system for cooling electrical components wherein the sorbate is desorbed from the sorbent using electromagnetic waves.

2. Related Art.

Certain electrical components, such as the microprocessors in conventional computers, generate a substantial amount of heat during operation. It has been determined that the performance of a microprocessor can be enhanced significantly by effectively removing this heat. In addition, in accordance with conventional semiconductor practice, it is known that the operating speed of a microprocessor can be greatly increased if the microprocessor is operated at low temperatures.

In adsorption and desorption systems, which will be referred to herein as "sorption systems", a first substance called a sorbate is alternately adsorbed onto and then desorbed from a second substance called a sorbent. Specific sorbates and sorbents will usually be selected for a particular sorption system to produce a desired effect, which is dependent on the affinity of the two substances. During an adsorption reaction, which is also referred to as the adsorb cycle or the adsorb portion of the sorption cycle, the sorbate is drawn onto and combines with the sorbate to produce a sorbate/sorbent compound. During the desorption reaction, which is also called the desorb cycle or the desorb portion of the sorption cycle, energy is supplied to the sorbate/sorbent compound to break the bonds between the sorbate and sorbent molecules and thereby desorb, or in other words separate or drive off, the sorbate from the sorbent. Substantial energy is imparted to the sorbate during the desorption reaction, and this energy can be harnessed for various uses.

An exemplary refrigeration sorption system may use a polar refrigerant, such as ammonia, as the sorbate and a metal halide salt, such as strontium bromide, as the sorbent. During the desorption reaction, which occurs in an enclosure called a sorber, the refrigerant molecules are driven off of the salt and, into a relatively high pressure, high energy gaseous state. The refrigerant gas is subsequently condensed and then evaporated to produce a cooling effect. The evaporated refrigerant gas is then channeled back to the sorber, where it is once again adsorbed onto the salt in an adsorption reaction. The sorption cycle is repeated numerous times depending on the cooling requirements of the refrigeration system.

In certain prior art sorption systems, the desorption energy is supplied by a conventional heater. In such a system, a great deal of thermal energy is required to stochastically heat the sorbate/sorbent compound to the degree sufficient to break the bonds between the sorbate and sorbent molecules. As a result, the sorbate, sorbent and sorber are significantly heated, and substantial time and/or energy are required to remove this sensible heat and cool the sorbers and sorbent before the next adsorption reaction can proceed.

In the refrigeration system of this invention, the desorption energy is supplied in the form of electromagnetic waves, such as radio frequency waves or microwaves, generated by, for example, a magnetron. Instead of heating the sorbate/sorbent compound, the electromagnetic waves selectively pump electrical energy into each sorbate-sorbent bond until the bond is broken and the sorbate molecule is separated from the sorbent molecule. Therefore, the sorbate, sorbent and sorber are not heated during the desorption reaction and consequently do not need to be cooled before the next adsorption reaction can proceed. As the desorption reaction is essentially isothermal, the overall performance of the refrigeration system is greatly improved.

SUMMARY OF THE INVENTION

According to the present invention, a refrigeration system for cooling an electrical component is provided which comprises a sorbor having a housing defining an enclosure, a sorbate/sorbent compound located within the enclosure, the sorber including a port through which a sorbate may be communicated into and out of the enclosure, and means for electrically coupling the sorber to an electromagnetic wave generator, wherein electromagnetic waves transmitted by the electromagnetic wave generator are propagated through the enclosure to desorb the sorbate from the sorbate/sorbent compound. The refrigeration system of the present invention also indudes a condenser connected to the port downstream of the sorber, an evaporator connected between the condenser and the port and positioned in close proximity to the electrical component, and a controllable expansion valve interposed between the condenser and the evaporator. In this manner sorbate which is desorbed in the sorber is condensed in the condenser and then controllably released into the evaporator to create a cooling effect and thereby cool the electrical component, after which the sorbate is drawn back into the sorber.

The absorbent bed must be able to provide sufficient heat and mass transport capabilities to allow for rapid adsorption of the refrigerant vapor. Without sufficient heat removal, the mass flow would have to be reduced, or alternately cooling power would be lost as the adsorption pressure would rise with sorbent bed temperature. Consequently, the goal is to maintain the adsorbent bed as close to the hot side heat rejection temperature as possible. The electromagnetic nature of the desorption phenomena places further restrictions on the architecture of the reactors as it cannot interfere with the propagation of microwave plane waves (TEM).

A microchannel reactor design is provided to satisfy the foregoing requirements. Although microchannels are often envisioned as being rectangular parallel channels, the exact geometry of the channels has very little effect on heat and mass transfer characteristics. Rather, the performance of the channels is largely dictated by channel depth and flow rate parameters. Flexibility and channel geometry accommodate the electromagnetic compatibility requirements of the reactor.

Microchannel reactors operate on the principle that within a microchannel, the thermal boundary layer is structurally constrained to less than half of the width of the fluid channel.

Heat transfer and laminar and transition flow regimes vary significantly from macroscale channels. Heat transfer in flow regimes is coupled to liquid temperature, velocity and channel size.

One feature of the invention is that the refrigerator and component cooled thereby may be conveniently removed from the system for upgrade or maintenance.

In accordance with the present invention, it is important that all chilled components of the system must be isolated from the ambient atmosphere to prevent condensation from forming on the cooled parts or on the external surfaces of paths to the cooled parts which are exposed to the atmosphere. Isolation prevents corrosion and other problems which are caused by the presence of condensed water.

One of the features of the present invention is that the desorption compressor is physically compact. This permits the compressor to be placed inside the removable module which includes the electronic components. The removable interface is associate with the hot end condenser of the refrigeration system. The hot side condenser is either a part of a countercurrent liquid-to-liquid heat exchanger or is cooled by evaporating a liquid from the hot surface. The demountable interface is the low pressure liquid loop to the heat exchanger. Detaching the module from the low pressure liquid loop is preferably accomplished in accordance with the invention using conventional double ended shut off fluid disconnects.

The isolation of the system from the atmosphere is obtained by enclosing the unit in a vacuum can. The hot end condenser may be used as one surface of the vacuum can (or a portion thereof) or be in close heat transferring proximity thereto. The compressor, evaporator, and cooled electronic components are supported away from the surface of the vacuum can so that there is no direct connection between an external surface of the vacuum can and the evaporator. This arrangement makes water vapor condensation unlikely and prevents corrosion of parts.

The high speed electrical signal connections to the electronic components may be made by means of optical coupling, utilizing fiber optics or by free space transmission through a window, in all situations providing for best thermal performance. It is also possible to provide such connections using a thin film on a polymer or glass flex circuit, although such a connection has potential difficulties in balancing the conflicting requirements of high thermal impedance with low electrical losses.

DC Power for the electronic components may be brought into the vacuum can through power feed-throughs which are thermally lagged to the hot end condenser before connecting to the cooled components.

It will be understood that the functions of the apparatus herein described include the following:
1. Providing a high insulation environment for low temperature cooling.
2. Providing an optical coupling into and out of this environment.
3. Providing a single high side heat removal path for both the cooling shell (heat load) and the solid state chemical reactor (sorber assembly) by using a single high side heat exchanger.
4. The device benefits from compactness, ease of fabrication, serviceability and modularity.

DETAILED DESCRIPTION OF THE PREFERRED EMBODIMENT:

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
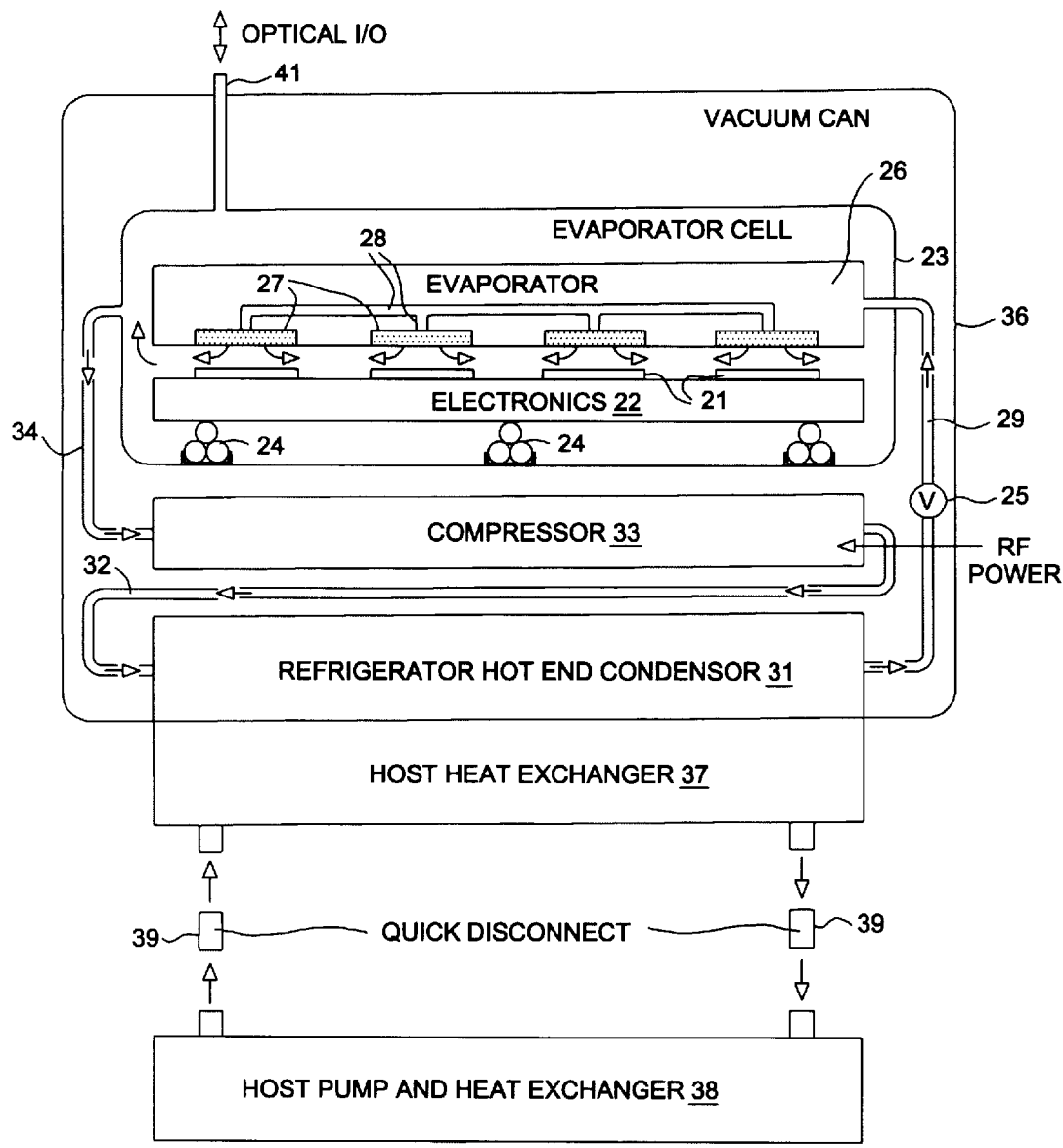
FIG. 1 is a schematic view of an embodiment of a cooling system for electronic components.

FIG. 1 illustrates schematically an embodiment of a cooling system for electronic components. The particular electronic components 21 mounted on board 22 are subject to wide variation. In general they are chips or the like which emit heat and which operate at optimum efficiency at reduced temperatures. In close relationship to the components 21 is the evaporator 26 which emits cold gaseous fluid through emission apertures in porous ceramic blocks 27 inset into the metal evaporator 26. Porous metal or glass frit plugs are likewise suitable. The number and the location of blocks 27 is subject of wide variation but, as shown in FIG. 1, are located immediately opposite a corresponding component 21. Channels 28 within the evaporator 26 interconnect blocks 27. The blocks 27 may function as valves to control emission of gas or a separate expansion valve 25 may also be used. Board 22 and evaporator 26 are isolated within a cell 23 which collects the gas emitted through apertures 27. Preferably standoffs 24 which may be of any of a variety of shapes separate the components 21 and evaporator 26 from the walls of cell 23.

Cell 23 is connected by conduit 34 to compressor 33 and thence by conduit 32 to condenser 31. The compressed, condensed gases are then recirculated by means of conduit 23 to evaporator 26 preferably through expansion valve 25. Compressor 33 is hereinafter discussed in detail.

Preferably board 22, evaporator 26, compressor 33 and refrigerator hot end condenser are isolated from the atmosphere by means of a vacuum can 36. In a preferred construction condenser 31 comprises at least a portion of one wall of vacuum can 36 or is in close proximity thereto so that heat transfer through the vacuum can occurs.

Immediately outside can 36 is a host heat exchanger 37 which absorbs heat from condenser 3 1. The liquid-to-liquid exchange of heat between condenser 36 and heat exchanger may be of any suitable type. Located apart from vacuum can 36 and heat exchanger 37 (it being understood that the latter is physically attached to condenser 31 and to can 36) is a host pump and heat exchanger 38. Heat exchanger 38 may be of widely different types, well understood in this art, preferably of a liquid-to-air type. One such device is LYTRON 5000 Series by Lytron, Inc of Woburn Mass. The connections between exchanger 37 and exchanger 38 are such that decoupling may be readily accomplished as by means of quick disconnect elements 39. Snap-Tite Series 28-1, by Snap-Tite, Inc. of Union City, Pa., or other quick disconnects are suitable.

A port 41 may pass into vacuum can 36. The port 41 may also pass into cell 23. The port 41 allows optical or electrical input/output conduits from an electronic system to be attached to the electronic components 21 and/or the board 22. Connectors attached to the conduits may allow a cooling system for electrical components 21 to be removed as a unit from the electronic system. The unit includes the host heat exchanger 37, the can 36, members of the cooling system within the can, the components 21 and the board 22.

Figure 4:
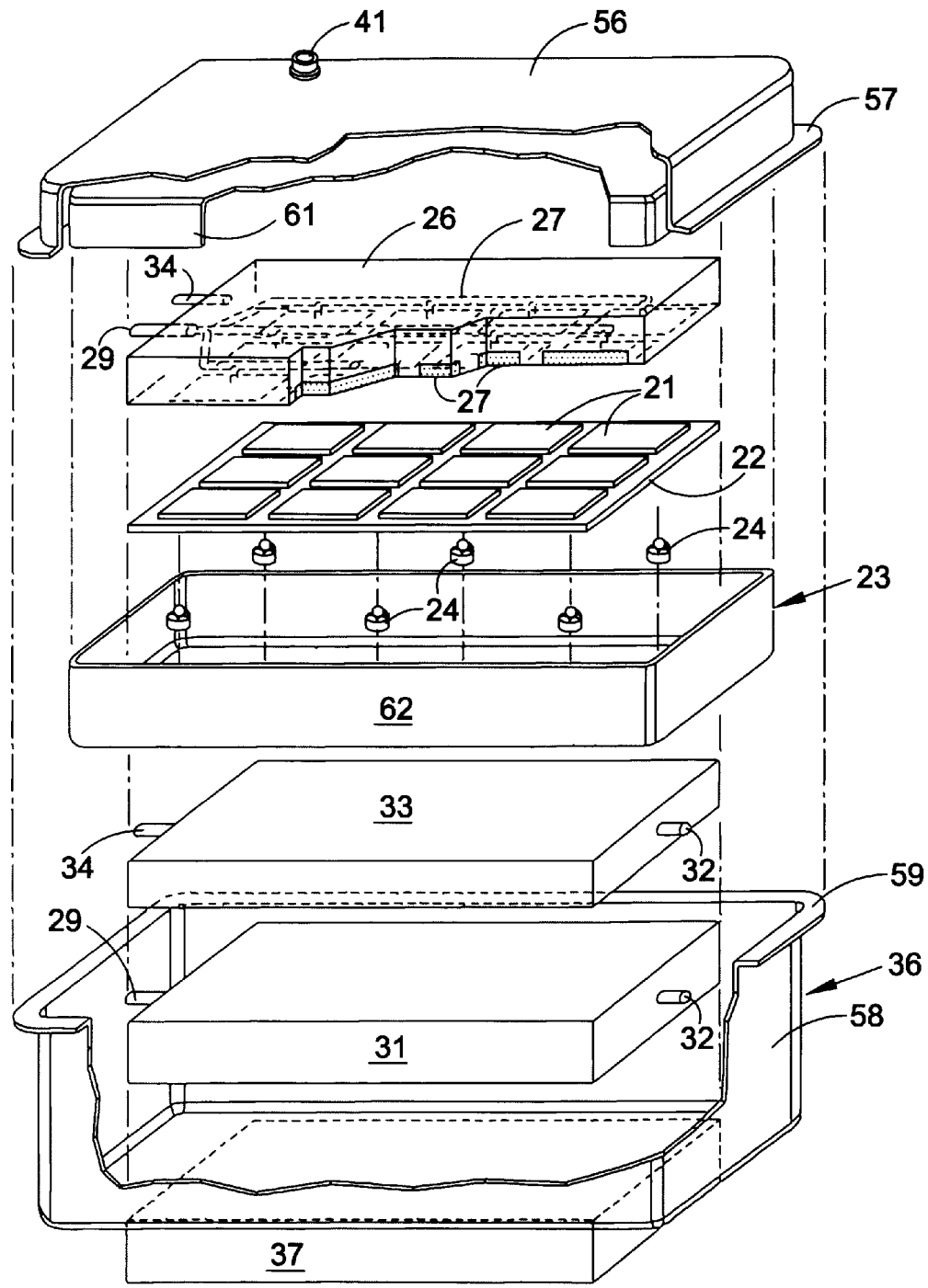
FIG. 4 is a schematic exploded perspective view of the modification of FIG. 1, partially broken away in section to reveal internal construction.
Figure 5:
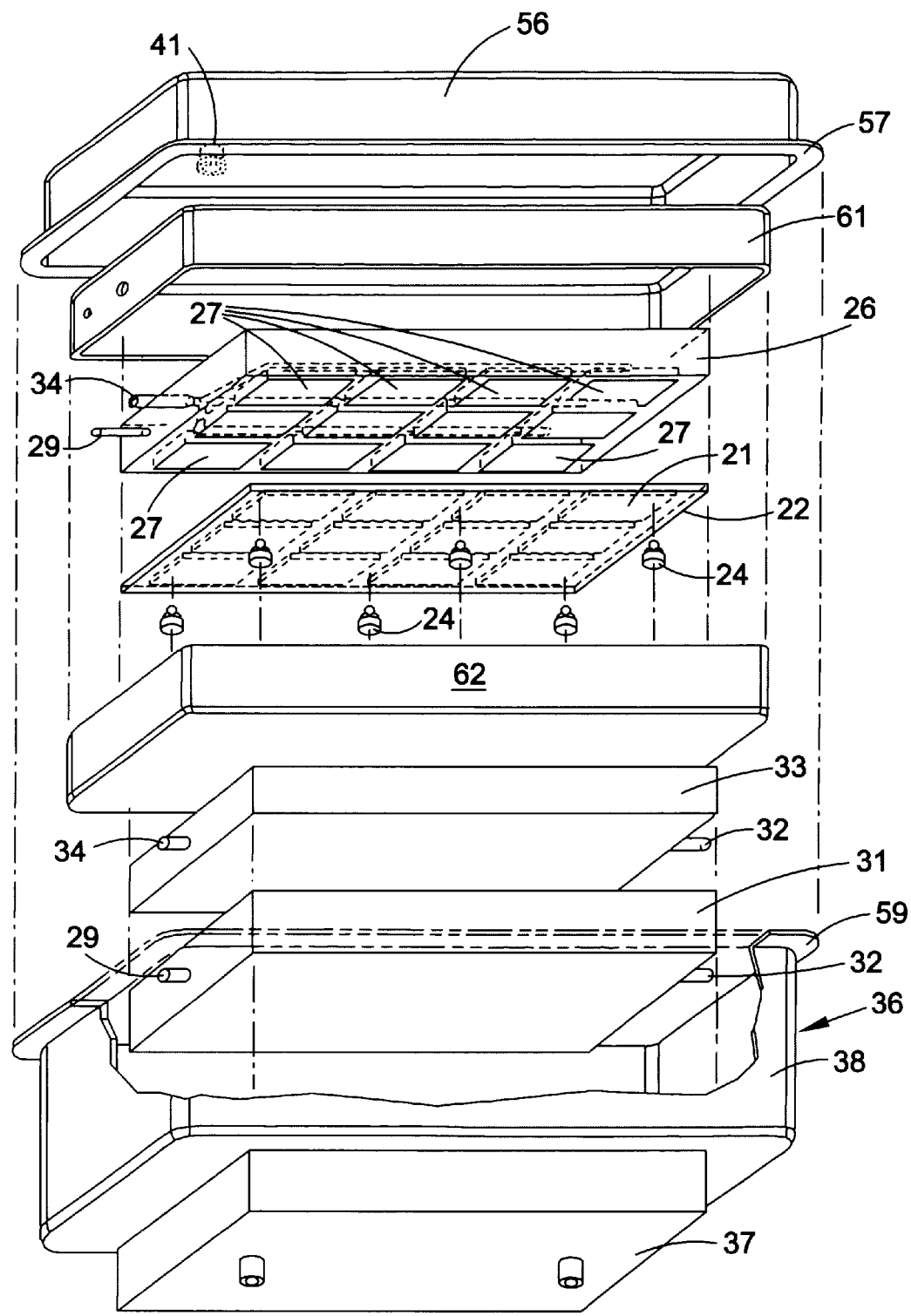
FIG. 5 is a view similar to FIG. 4 taken from a different angle.
Figure 6:
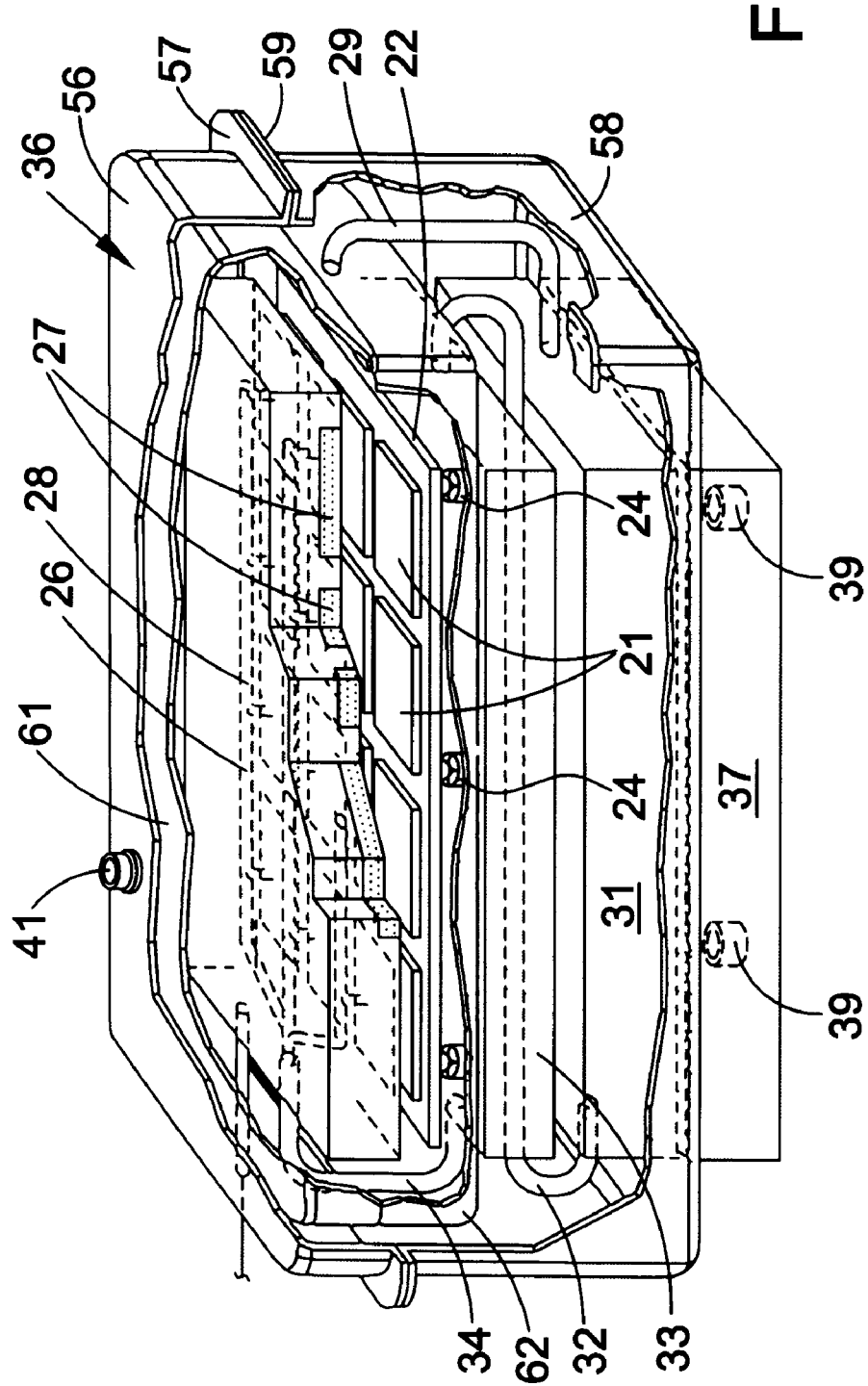
FIG. 6 is a perspective view showing the structure of FIG. 1 with parts broken away to reveal internal construction.

Some additional structural details of the components may be observed in FIGS. 4–6. The vacuum can 36 may be fabricated in two parts namely an upper half 56 having a peripheral external flange 57 and a lower half 58 having a flange 59 which mates with flange 57. Similarly, cell 23 may comprise an upper half 61 and a lower half 62 which are suitably sealed together.

Figure 2:
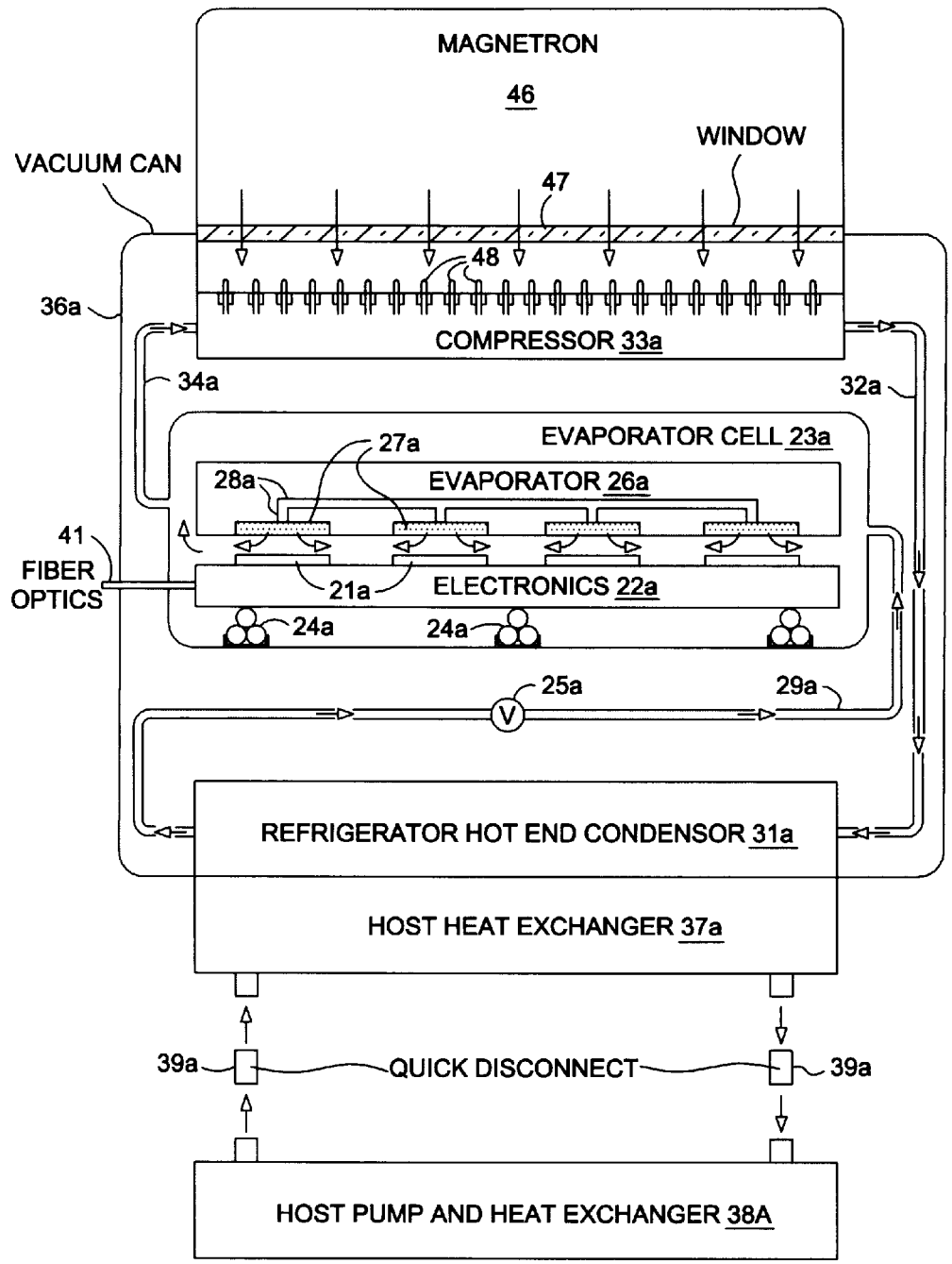
FIG. 2 is a view similar to FIG. 1 of another modification.

FIG. 2 illustrates a modification of FIG. 1 wherein compressor 33a is located adjacent a wall of vacuum can 36a, the wall being pervious through a window and wave guide 47 to emissions from magnetron 46. A magnetron similar to those used in microwave ovens is satisfactory. For such purpose, compressor 33a is provided with probes 48 which serve as antennas for field emissions from the magnetron 46.

Figure 3:
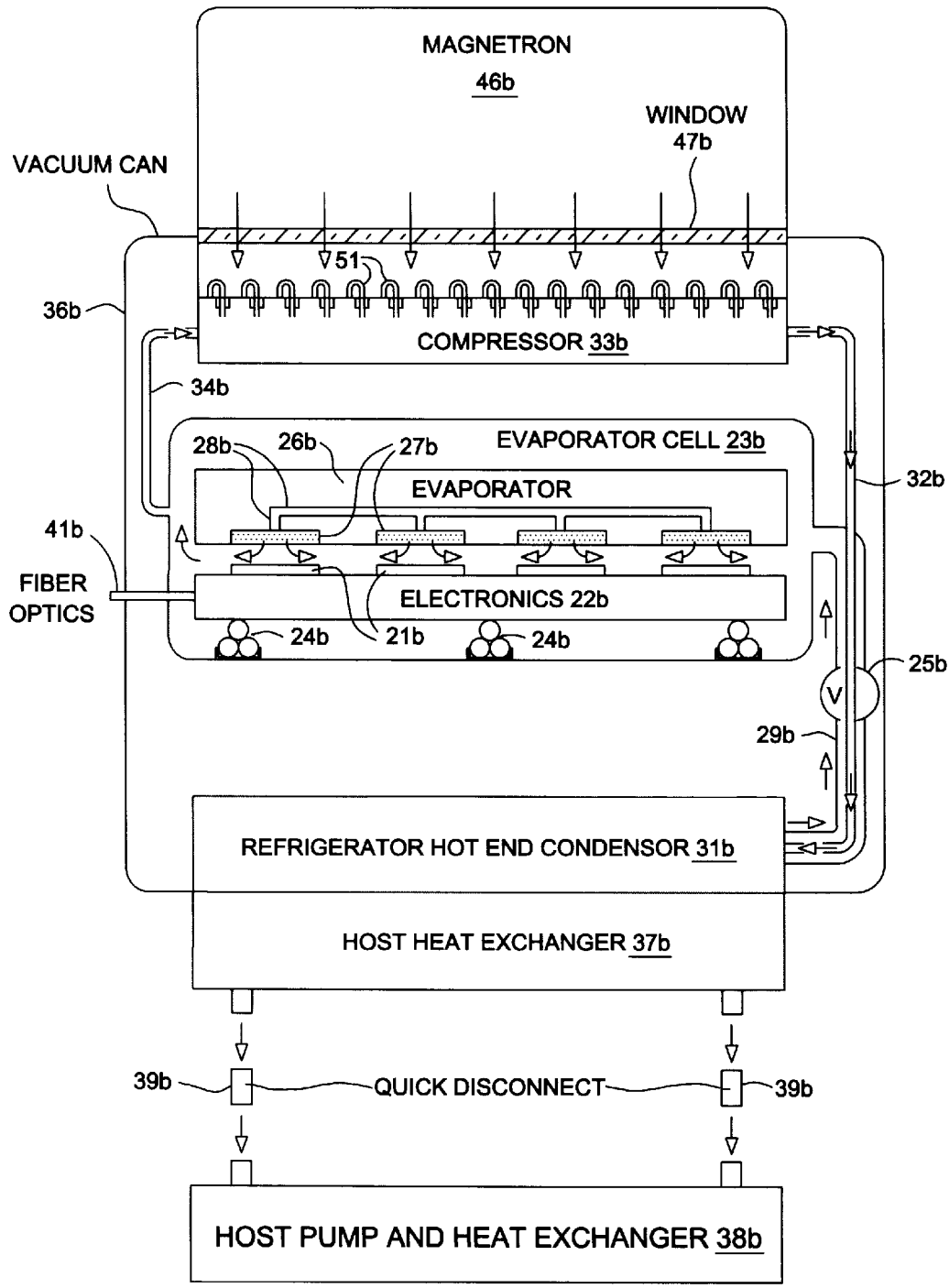
FIG. 3 is a schematic view of another embodiment of a cooling system for electronic components.

FIG. 3 is a further modification resembling FIG. 2 wherein the loop antennae 51 are of a different style than the elements 48 of FIG. 2.

In other respects, the modifications of FIGS. 2 and 3 resemble those of FIG. 1 and the same reference numerals followed by subscripts a and b respectively represent corresponding parts.

Figure 7:
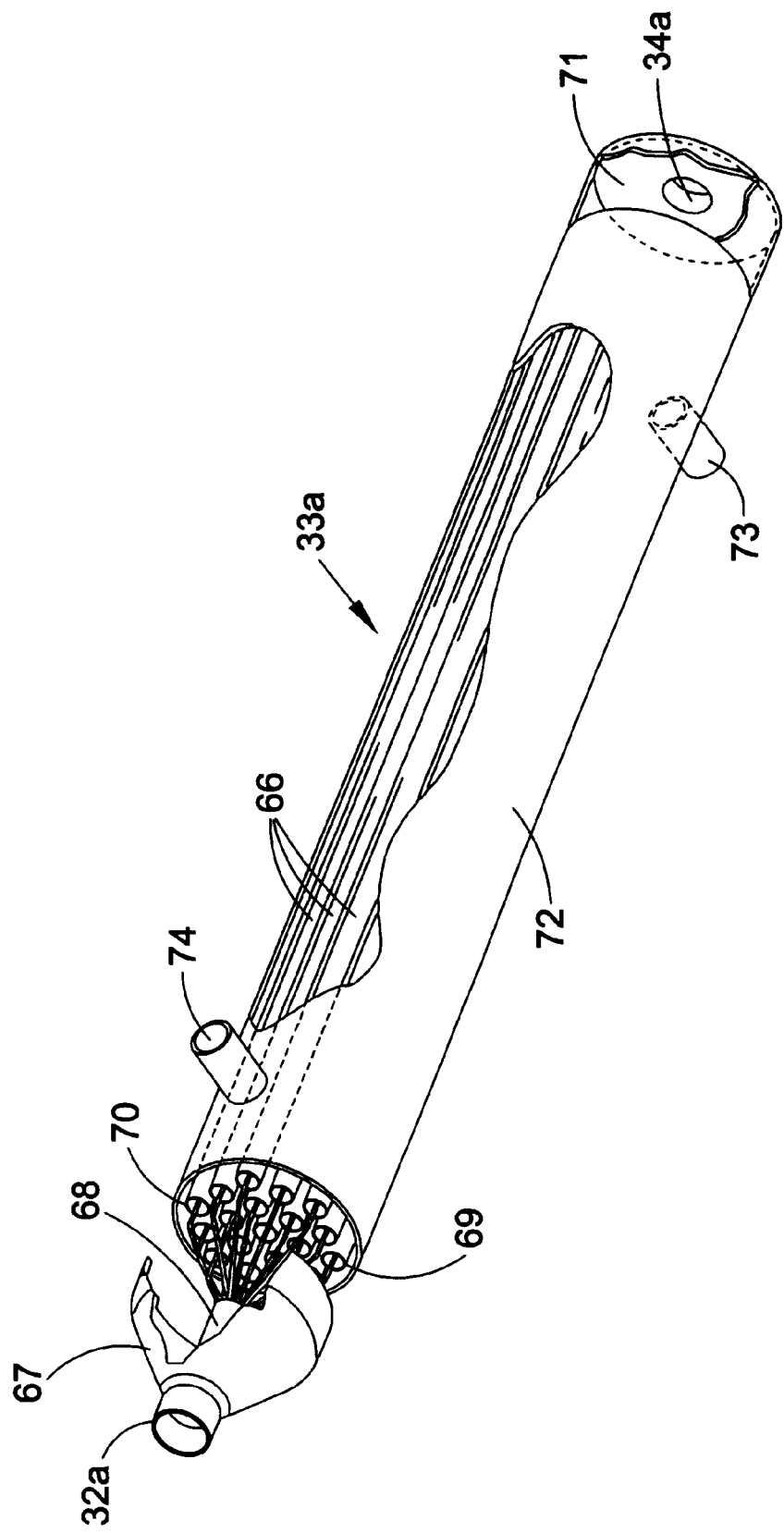
FIG. 7 is a perspective view, partly broken away in section to reveal internal construction, of an embodiment of a compressor.
Figure 8:
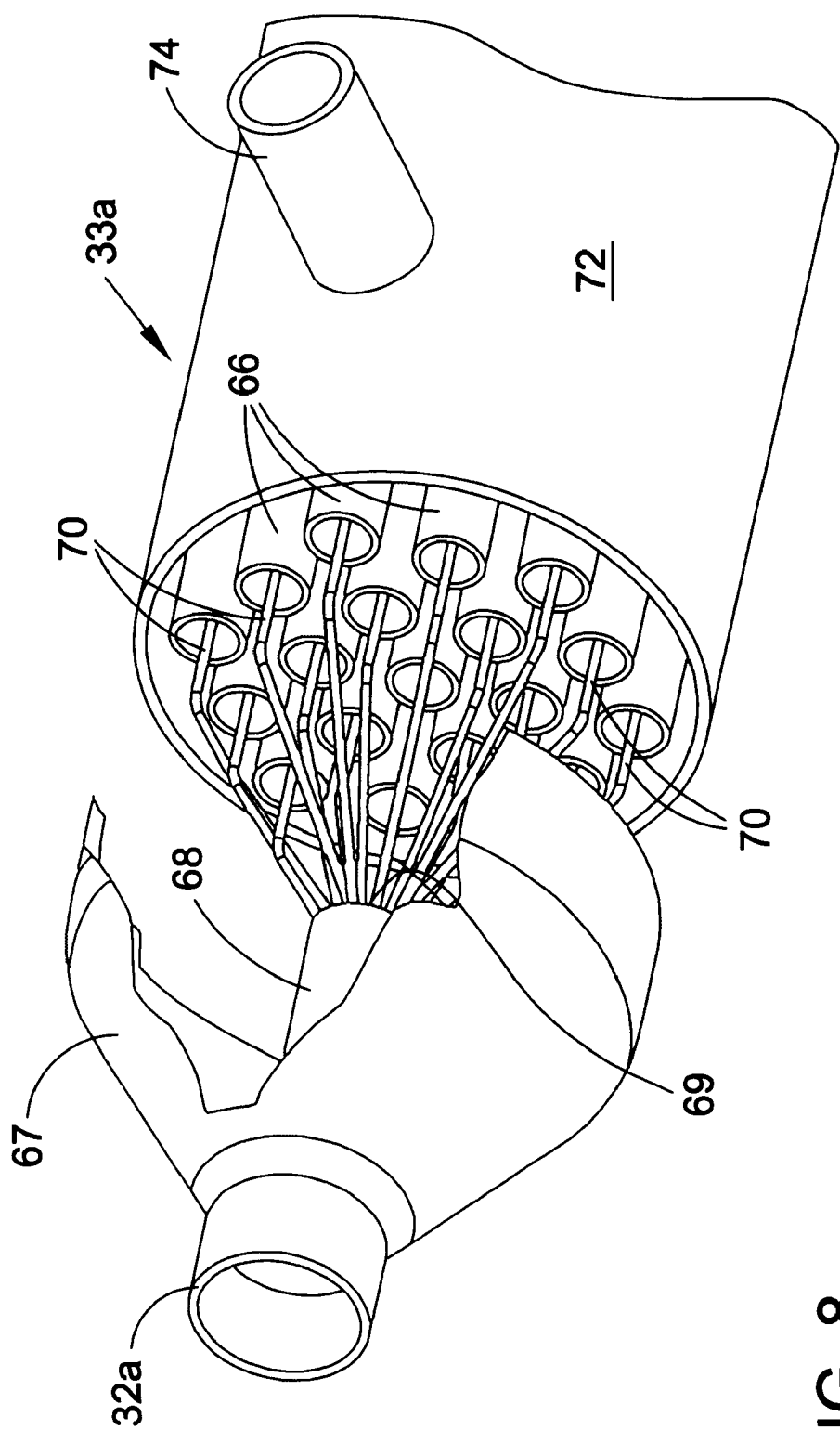
FIG. 8 is an enlarged view of a portion of FIG. 7.

A series of representative compressors are illustrated and described herein. It will be understood that these are merely representative of compressors which may be used in accordance with the present invention. Turning to the form shown in FIGS. 7 and 8, a plurality of parallel tubes 66 each lined with a sorbate as hereinabove defined is provided. Although the compressor shown in FIGS. 7–8 is round in cross-section, other shapes may be used. At one end thereof is a manifold 67 into which the output of condenser 31 is conveyed so that the gas flows through the tubes 66 and interacts with the sorbate thereon. Also, entering the compressor 33a through manifold 67 is RF connector 68 which leads to a splitter 69 having a plurality of applicators 70 leading down through the tubes 66. At such time as it is necessary to desorb the material in the tubes 66, microwave or other waves are applied in the insides of the tubes 66 causing the gas to be released into manifold 71 at the opposite end of the compressor 33a, from which the gases may be conducted to evaporator 26 by means of conduit 34a. The tubes 66 may be enclosed in a jacket 72. Optionally, a coolant liquid may be introduced into the jacket 72 through inlet port 73 and conducted out through outlet port 74.

Figure 9:
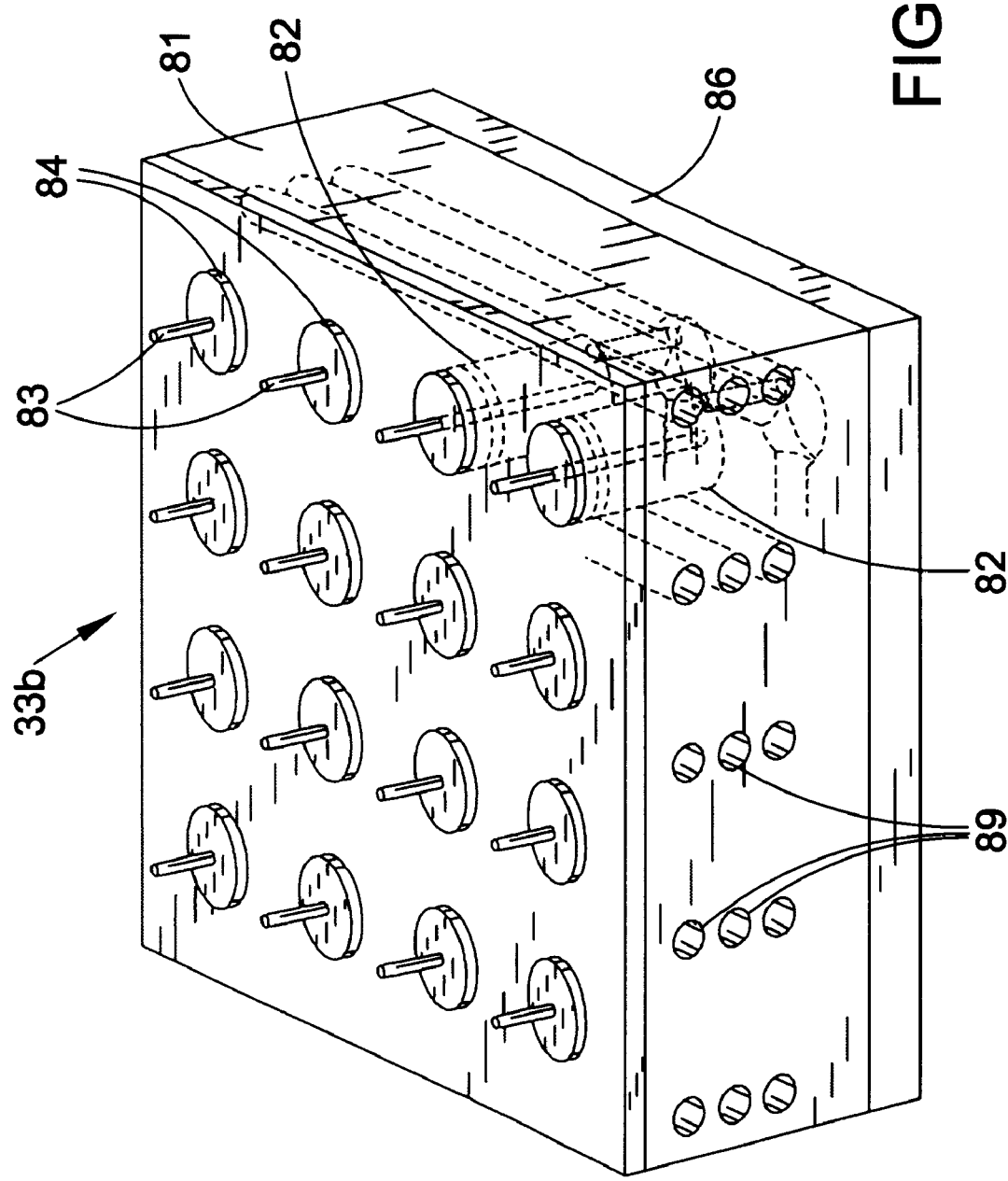
FIG. 9 is a perspective view of an alternate embodiment of a compressor that may be used in the cooling system embodiment shown in FIG. 2.
Figure 10:
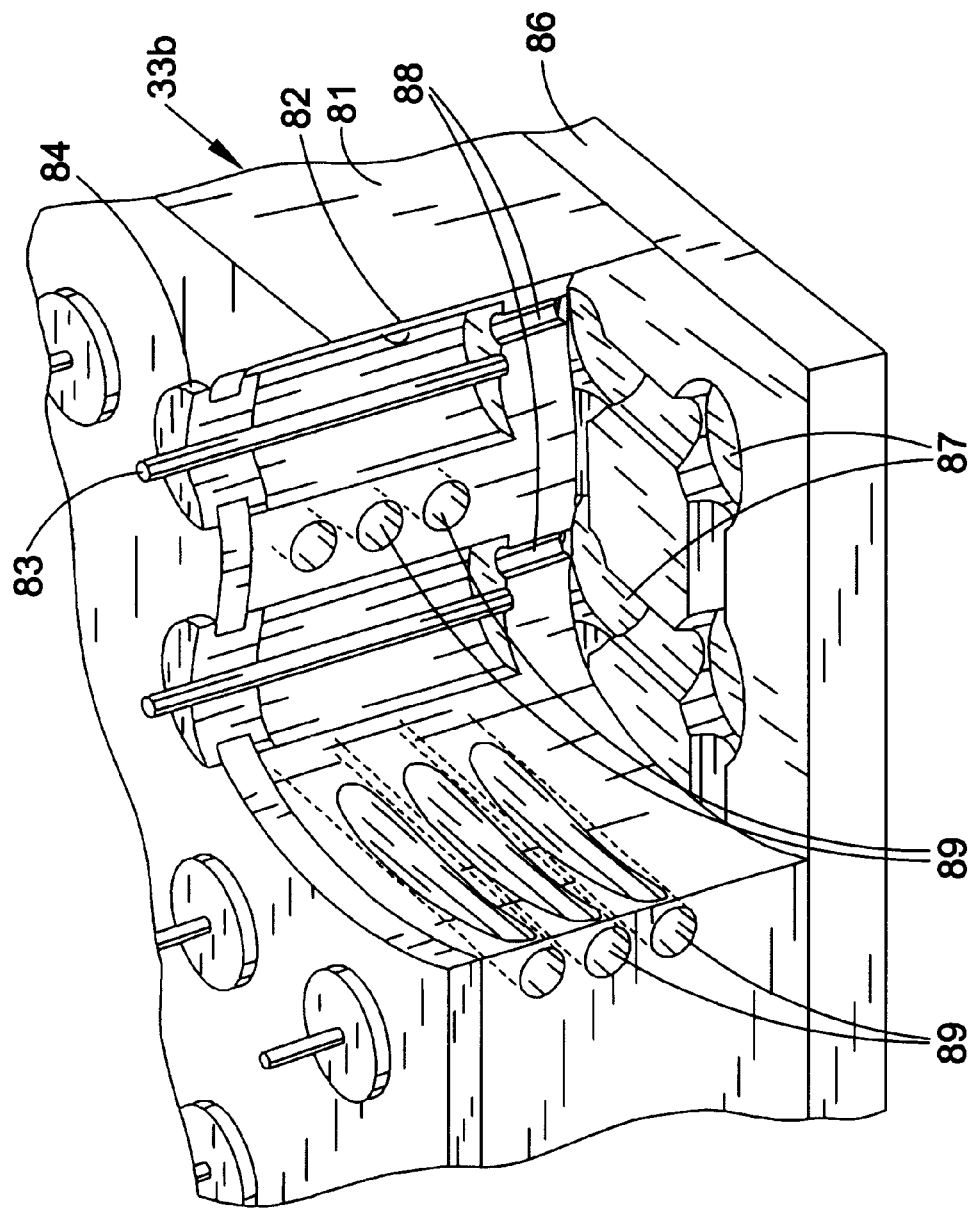
FIG. 10 is an enlarged perspective view of a portion of FIG. 9 with parts broken away to reveal internal construction.
Figure 11:
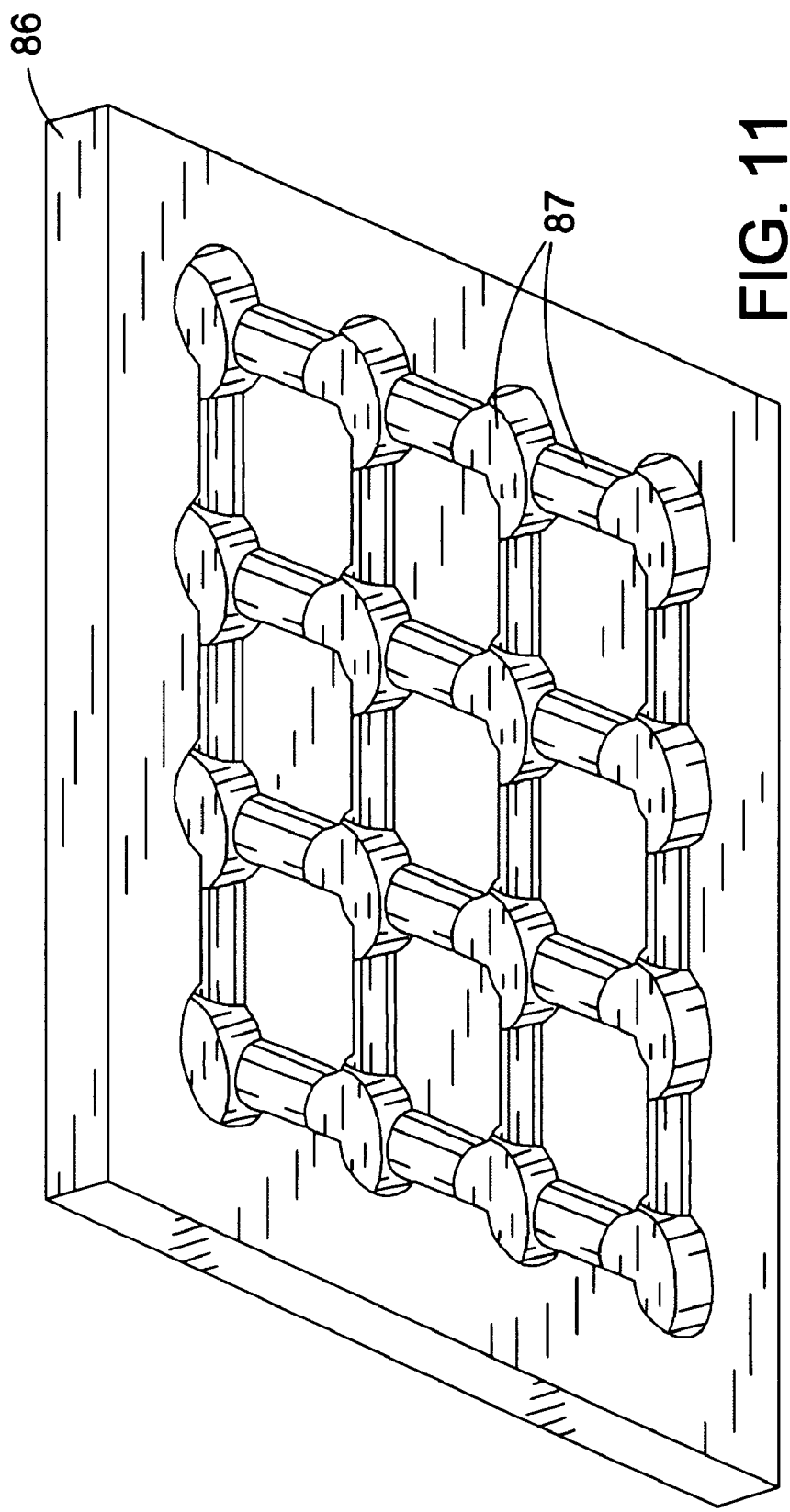
FIG. 11 is a perspective view of the bottom of the structure of FIG. 9.

FIGS. 9–11 also shows a coaxial seal applicator array, but the array differs in the excitation mechanism and size of the applicators. In this embodiment, the compressor 33b is rectangular in shape. It will be understood that the shape is subject to variation. As here shown, compressor 33b is formed with a body 81 into which are recessed pockets 82 each lined with a sorbent. Applicators 83 are introduced through seals 84 in the top of body 81 and extend down through the pockets 82. Applicators 83 may resemble the probe antennas 48 shown in FIG. 2 or may be otherwise constructed.

Bottom plate 86 is sealed to body 81 and is formed with passageways 87 connected to conduits 32 and 34 (not shown). Ducts 88 interconnect pockets 82 with passageways 87 as best shown in FIG. 10. Optionally, cooling passageways 89 may be formed in body 81 for cooling purposes.

Figure 12:
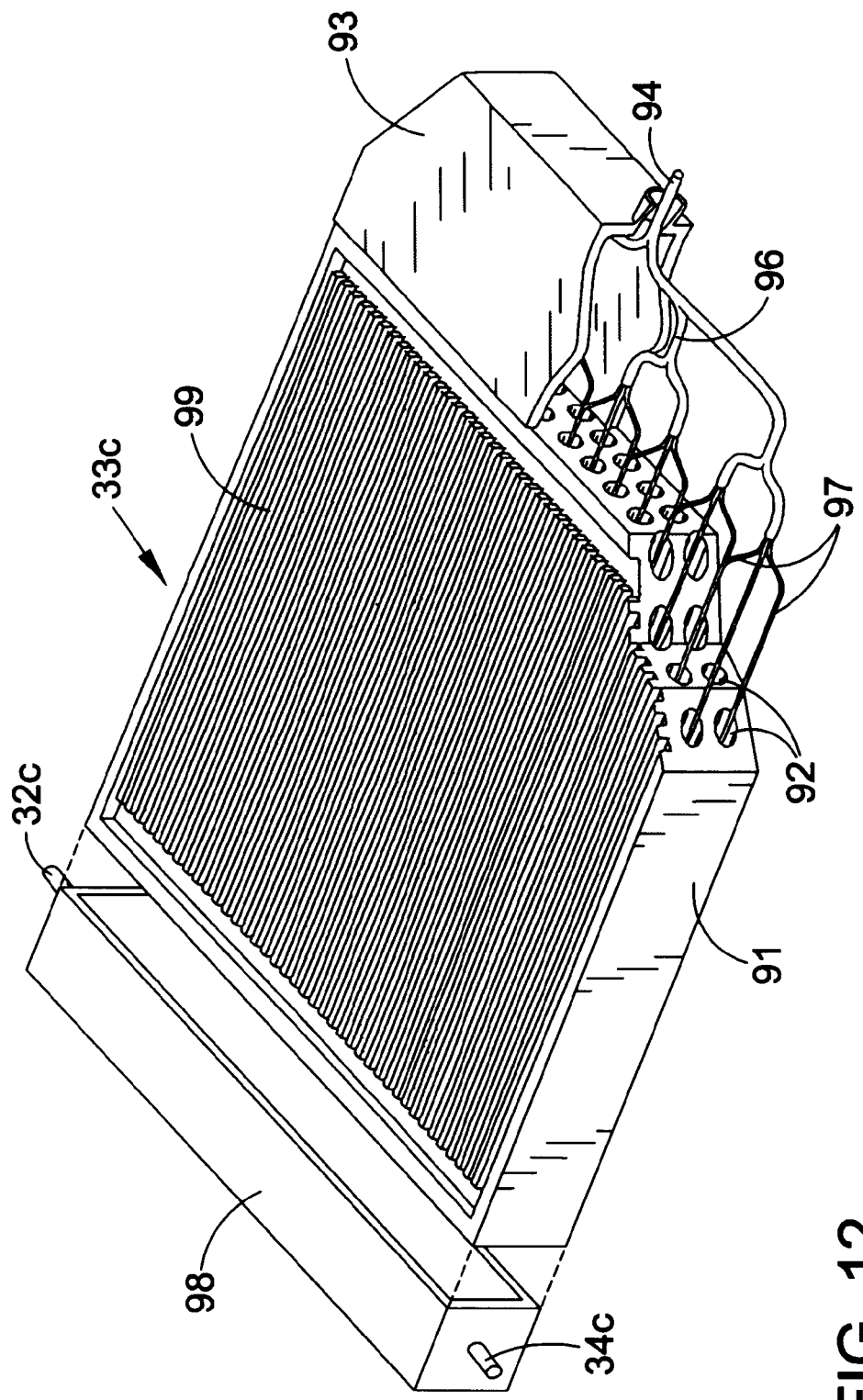
FIG. 12 is a perspective view, with parts broken away to reveal internal construction, of an embodiment of a compressor.
Figure 13:
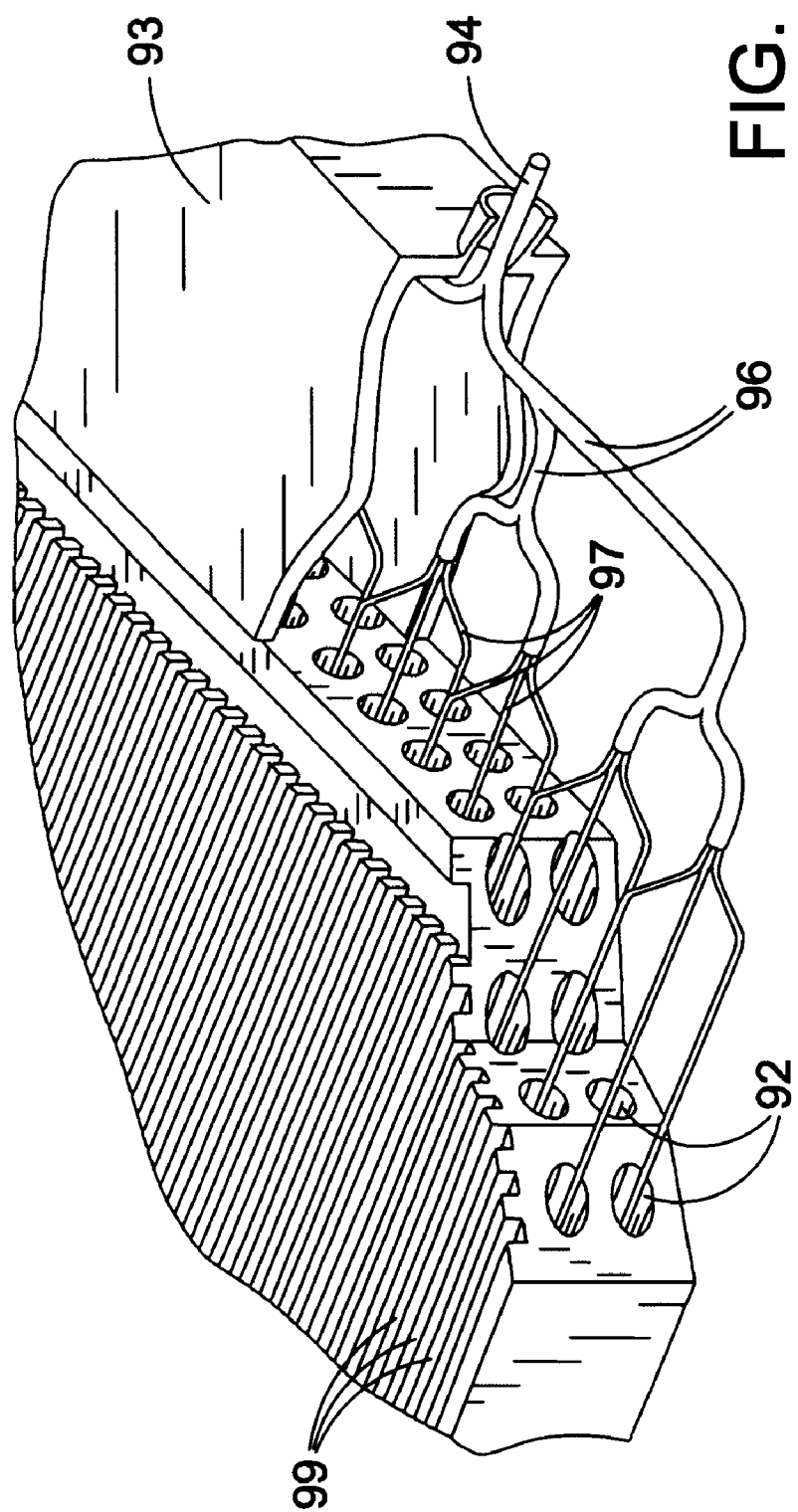
FIG. 13 is an enlarged view of a portion of FIG. 12.
Figure 14:
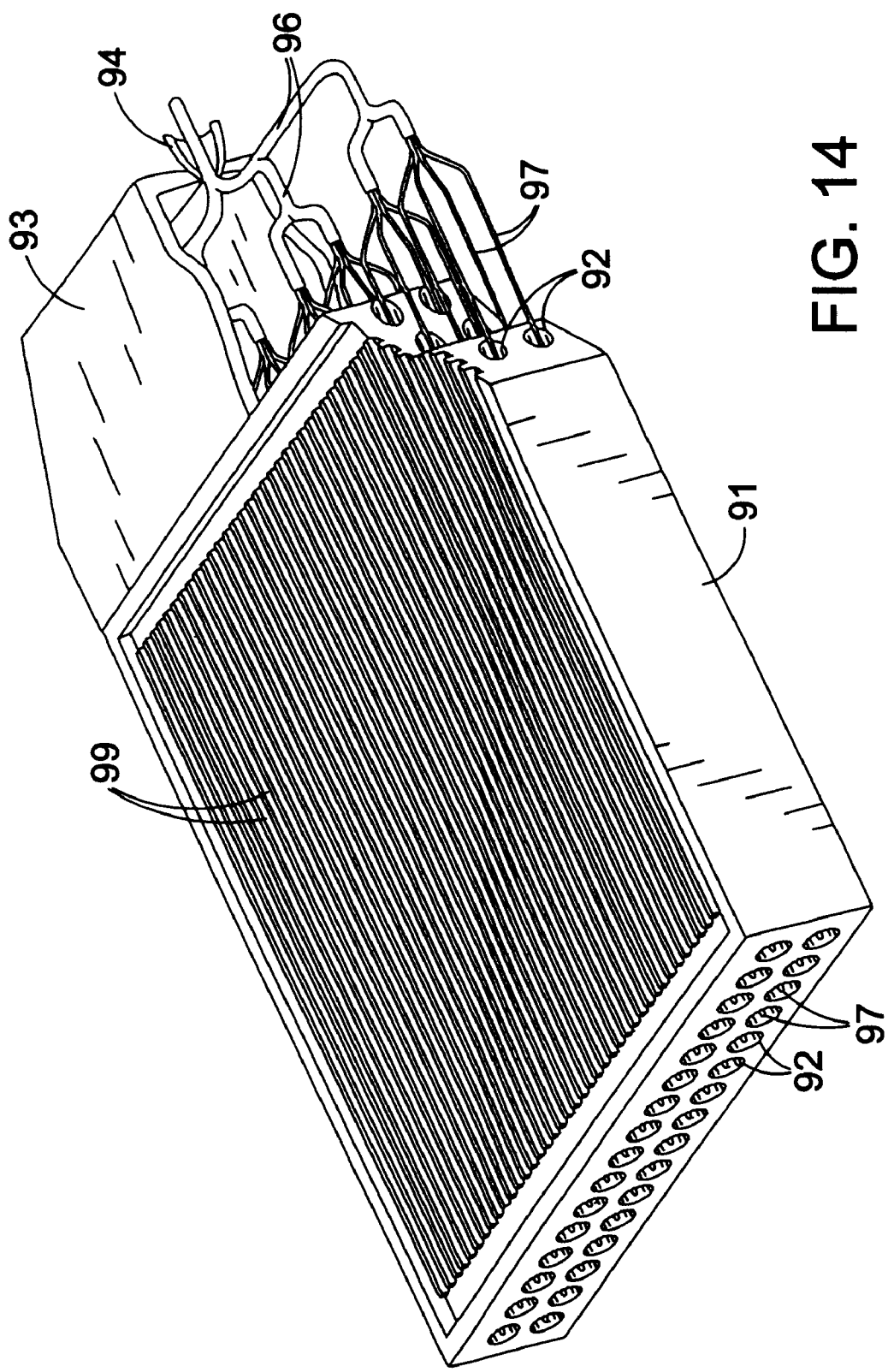
FIG. 14 is a perspective view of the compressor of FIG. 12 or 13, as viewed from a different angle.
Figure 15:
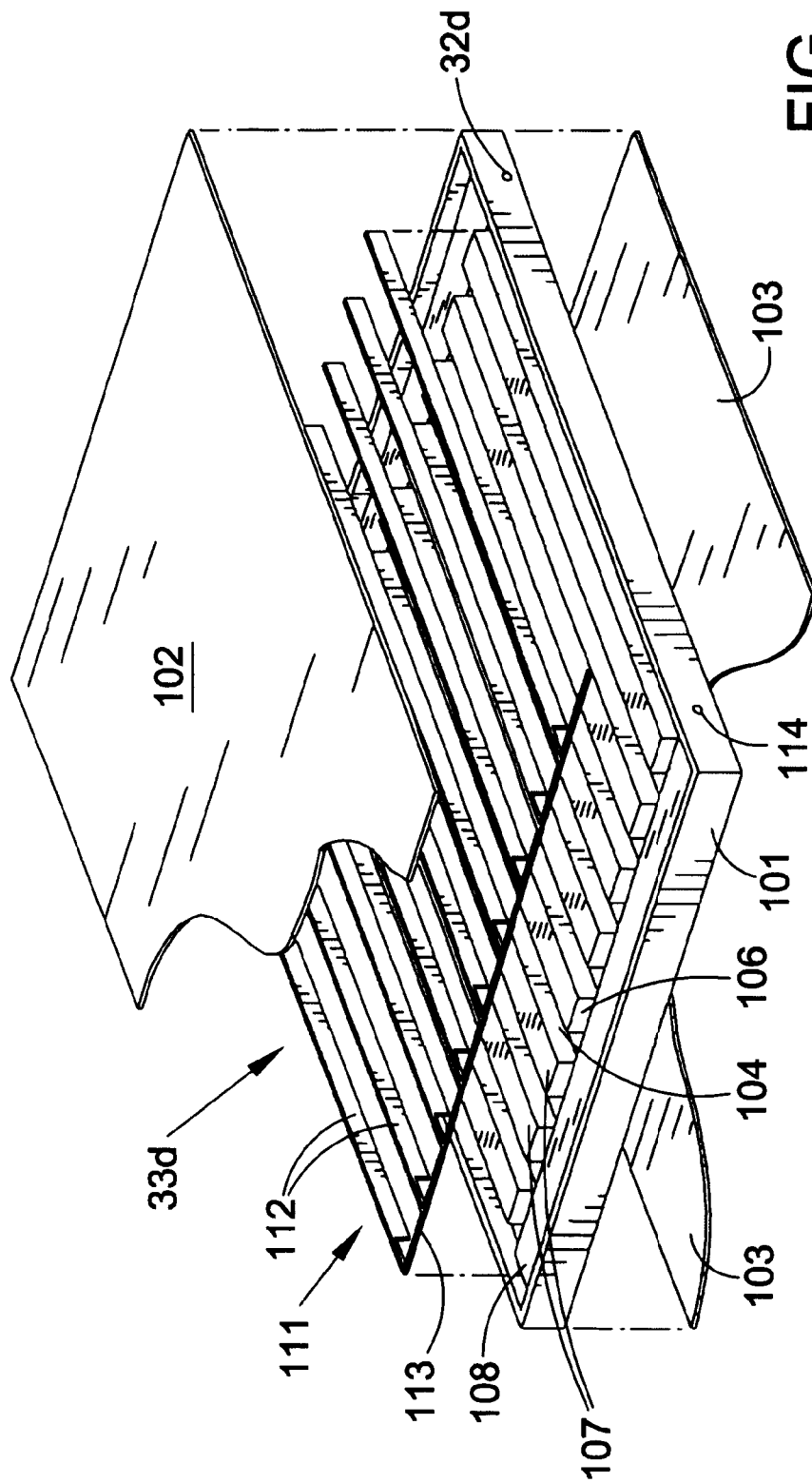
FIG. 15 is an exploded perspective view of an embodiment of a compressor.
Figure 16:
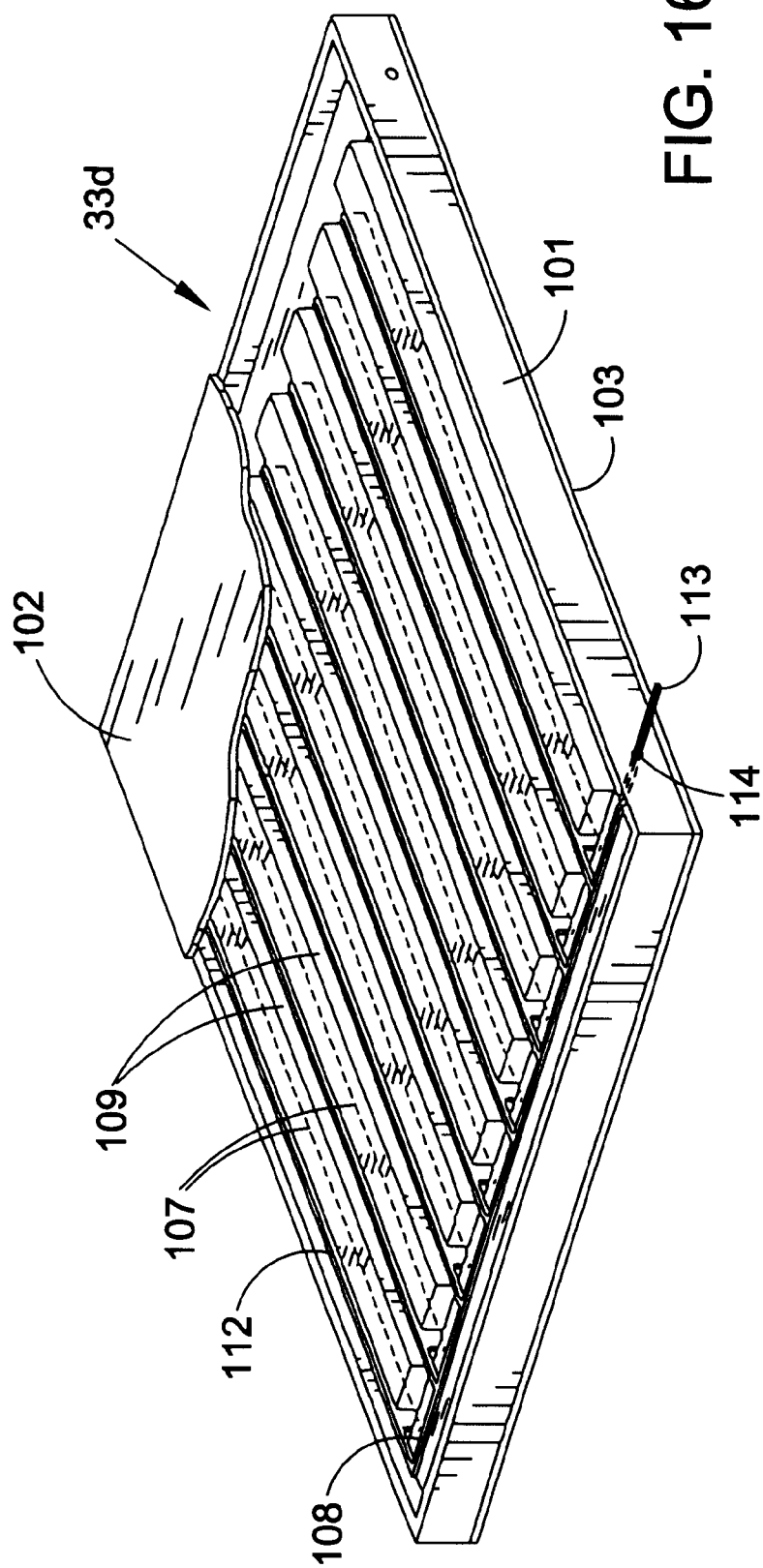
FIG. 16 is a perspective view of the structure of FIG. 15 assembled with a portion thereof broken away to reveal internal construction.
Figure 17:
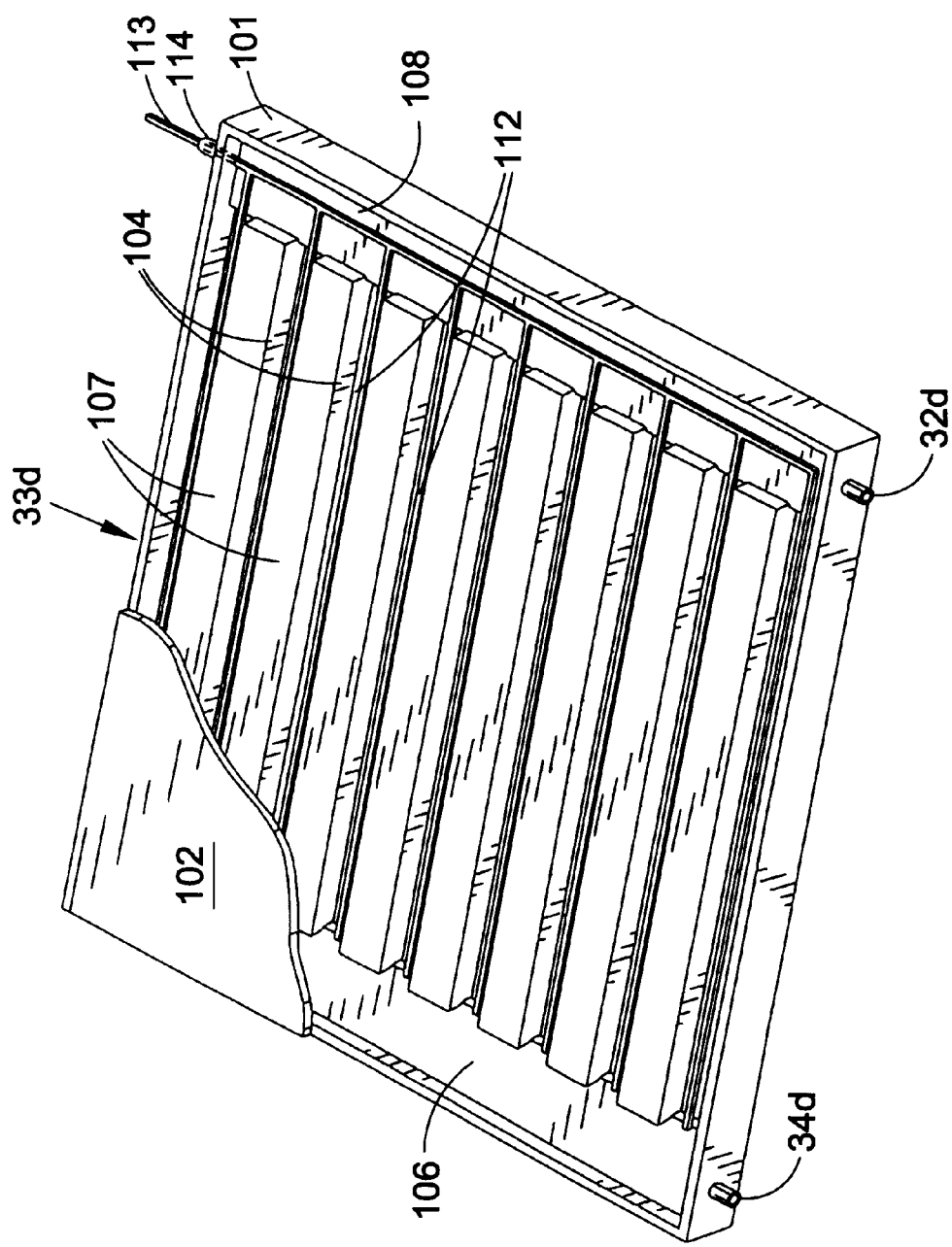
FIG. 17 is a perspective view of a portion of the structure of FIG. 16, viewed from a different angle.
Figure 18:
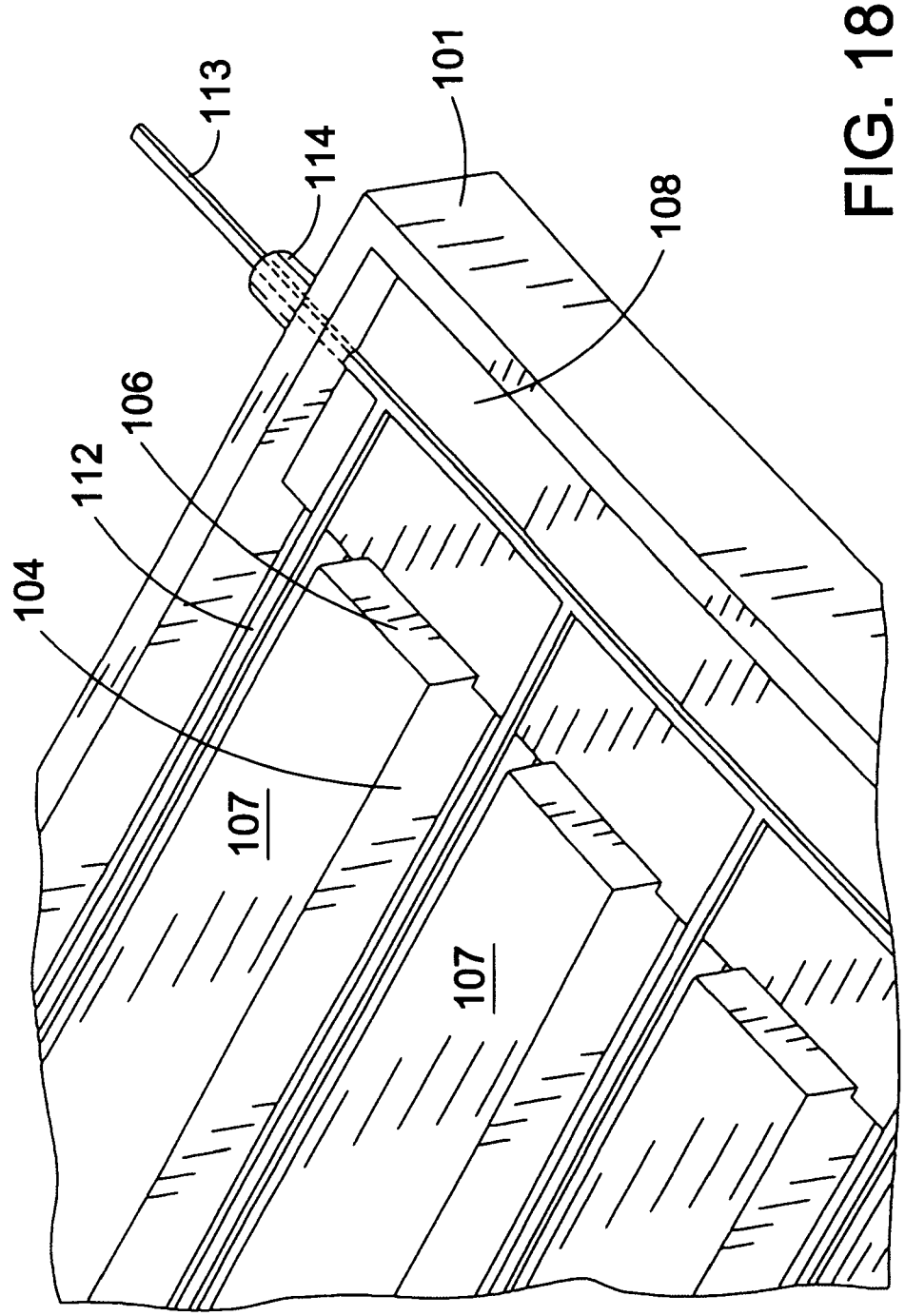
FIG. 18 is an enlarged view of a portion of the structure of FIGS. 15–17.

FIGS. 12–14 illustrate another compressor 33c having a flat coaxial applicator array. Block 91 is formed with parallel longitudinal bores 92, each lined with sorbent. At one end of block 91 is manifold 93 having an RF connector 94 leading to a splitter 96 within the manifold 93. From splitter 96 lead waveguide applicators 97, one of which extends down through the longitudinal axis of each bore 92. At the end of block 91 opposite manifold 93 is a manifold 98 having connector 32c at one end and connector 34c at the opposite end. For cooling purposes, optional longitudinal grooves 99 may be formed on the exterior of block 91 and a cover (not shown) over block 91 provides for circulation of cooling fluid through the grooves 99.

Still another compressor 33d is shown in FIGS. 15–18. The applicator may be fabricated using lithographic techniques. In this modification, block 101 is provided with a cover 102 on one side and a bottom 103 on the opposite side. Longitudinal channels 104 are etched into block 101 as are transverse panels 106 at either end, providing dividers 107 between the channels 104. The sides of dividers 107 and the bottoms of longitudinal channels 104 are lined with sorbent, as in the previous modifications. At one end, a shelf 108 is formed. Applicator 111 comprises longitudinal members 112 and an end connector 113 or feed. The longitudinal members 112 fit into the spaces between the dividers 107. Feed 113 rest on shelf 108 and exits block 101 through insulator 114. Gas from condenser 32 enters the channels 104 and 106 through opening 32d in block 101 and interacts with a sorbent. RF power is applied to grid 111 at the end of the absorbing portion of the cycle, causing the gas to split from the sorbent and exit block 101 through conduit 34d leading to evaporator 26.

In other respects, the modifications of FIGS. 7–8; 9–11; 12–14; and 15–19 resemble those shown in FIG. 1 and the same reference numerals followed by subscripts a, b, c and d, respectively, indicate corresponding parts.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. In combination for use in an electrical system, an electronic component, an evaporator in proximity to said component, the evaporator positioned to cool said component, a compressor having a surface coated with a sorbate/sorbent compound, a manifold on said compressor for admission to said compressor of sorbate to adsorb with said compound, a wave guide applicator in said compressor operable to desorb sorbate from said compound, said manifold collecting gasses desorbed in said compressor, a condenser for condensing gasses from said evaporator, a first conduit from said evaporator to said compressor, a second conduit from said compressor to said condenser and a third conduit from said condenser to said evaporator.

2. The combination of claim 1 which further comprises an enclosure for said evaporator.

3. The combination of claim 1 which said manifold comprises a first manifold portion connected to said first conduit and a second manifold portion connected to said second conduit.

4. The combination of claim 1 which further comprises a thermal enclosure for the evaporator, electronic component, compressor, and condenser; and a heat exchanger in working relation to the condenser, said heat exchanger having at least a portion external to said enclosure.

5. The combination of claim 3 in which said heat exchanger has a first portion external to said enclosure and a second portion in proximity to said condenser and conduits connecting said first and second portions.

6. The combination of claim 5 in which said conduits comprise quick disconnect couplings.

7. The combination of claim 4 which further comprises a first heat exchanger portion outside said enclosure and physically attached to said condenser, a second heat exchanger portion, and at least one conduit interconnecting said portions.

8. The combination of claim 7 which further comprises a quick disconnect in said conduit.

9. The combination of claim 1 in which said evaporator comprises a base and a plurality of porous blocks inset into said base.

10. The combination of claim 9 in which there is a plurality of said components and a porous block in said base positioned opposite each said component.

11. The combination of claim 1 in which said component and said evaporator are enclosed in a cell.

12. The combination of claim 11 in which there is a plurality of said components mounted on a board.

13. The combination of claim 12 in which said board and said evaporator are enclosed in and are physically supported away from said cell.

14. The combination of claim 1 in which said component, said evaporator, said compressor and at least a portion of said condenser are mounted in a vacuum can.

15. The combination of claim 14 in which a portion of said condenser is external to said vacuum can.

16. The combination of claim 1 which further comprises an expansion valve in said third conduit.

17. The combination of claim 1 in which said compressor comprises a plurality of tubes each lined with sorbate/sorbent compound, said manifold communicating with ends of said tubes and at least one wave-guide applicator extending longitudinally inside each said tube.

18. The combination of claim 17 in which said manifold is positioned at a first end of said tubes and which further comprises a second manifold at a second end of said tubes opposite said first end.

19. The combination of claim 17 which further comprises a jacket around the outsides of said tubes.

20. The combination of claim 19 which further comprises ports in said jacket for circulation of coolant.

21. The combination of claim 1 in which said compressor comprises a body formed with a plurality of recessed pockets lined with sorbate/sorbent compound, at least one wave-guide applicator extending through each said pocket, said manifold comprising ducts formed in said body interconnecting said pockets.

22. The combination of claim 21 which further comprises seals at at least one end of each said pocket, said applicators passing through said seals.

23. The combination of claim 21 in which said body is also formed with passageways for coolant around said pockets.

24. The combination of claim 1 in which said compressor comprises a body having a plurality of bores formed therein lined with said sorbant/sorbent, and a plurality of wave-guide applicators, one said applicator extending down through each said bore.

25. The combination of claim 24 which further comprises an RF connector extending into said manifold and a splitter within said manifold, said splitter connecting each said applicator to said connector.

26. The combination of claim 24 in which said body is formed with external grooves for cooling said compressor.

27. The combination of claim 1 in which said compressor comprises a body formed with external parallel channels lined with said sorbate/sorbent, a cover over said channels and wave-guide members extending down each said channel, said wave-guide members being connected to a transverse end connector, said manifold comprising a space in said body inside said cover interconnecting said channels.

28. The combination of claim 24 in which said wave guide members are formed in a grid comprising longitudinal members fitting into said channels and at least one transverse member interconnecting said longitudinal members and extending outside said body.

29. A compressor for use in a system for cooling a heat-emitting electrical component, said compressor having a surface coated with a sorbate/sorbent compound, a wave-guide applicator proximate said surface to desorb sorbate from said compound and a manifold to collect gasses desorbed in said compressor.

30. A compressor according to claim 29 which further comprises a plurality of tubes each lined with sorbate/sorbent compound, said manifold communicating with ends of said tubes and at least one wave-guide applicator extending longitudinally inside each of said tubes.

31. A compressor according to claim 30 in which said manifold is positioned at a first end of said tubes and which further comprises a second manifold at a second end of said tubes opposite said first end.

32. A compressor according to claim 30 which further comprises a jacket around the outsides of said tubes.

33. A compressor according to claim 32 which further comprises ports in said jacket for circulation of coolant.

34. A compressor according to claim 29 which further comprises a body formed with a plurality of recessed pockets lined with sorbate/sorbent compound, at least one wave-guide applicator extending through each said pocket, said manifold comprising ducts formed in said body interconnecting said pockets.

35. A compressor according to claim 34 which further comprises seals at at least one end of each said pocket, said applicators passing through said seals.

36. A compressor according to claim 34 in which said body is also formed with passageways for coolant around said pockets.

37. A compressor according to claim 29 which further comprises a body having a plurality of bores formed therein lined with said sorbate/sorbent, and a plurality of wave-guide applicators, one said applicator extending down through each said bore.

38. A compressor according to claim 34 which further comprises an RF connector extending into said manifold and a splitter within said manifold, said splitter connecting each said applicator to said connector.

39. A compressor according to claim 38 in which said body is formed with external grooves for cooling said compressor.

40. A compressor according to claim 29 which further comprises a body formed with external parallel channels lined with said sorbate/sorbent, a cover over said channels and wave-guide members extending down each said channel, said wave-guide members being connected to a transverse end connector, said manifold comprising a space in said body inside said cover interconnecting said channels.

41. A compressor according to claim 24 in which said wave-guide members are formed in a grid comprising longitudinal members fitting into said channels and at least one transverse member interconnecting said longitudinal members and extending outside said body.

42. The combination of claim 1, wherein the combination is detachable as a unit from said system.

43. The combination of claim 4, further comprising a port that passes into the enclosure.

44. The combination of claim 4, further comprising a cell, wherein the evaporator and the component are enclosed in the cell.

45. The combination of claim 44, further comprising a port that passes into the enclosure and the cell.

46. The combination of claim 44, further comprising a board within the cell, wherein the electronic component is mounted on the board.

\* \* \* \* \*